United States Patent
Chiu et al.

[19]

[11] Patent Number: 5,987,890
[45] Date of Patent: Nov. 23, 1999

[54] ELECTRONIC COMPONENT COOLING USING A HEAT TRANSFER BUFFERING CAPABILITY

[75] Inventors: George Liang-Tai Chiu, Cross River; Gareth Geoffrey Hougham, Ossining; Lawrence Shungwei Mok, Brewster, all of N.Y.

[73] Assignee: International Business Machines Company, Armonk, N.Y.

[21] Appl. No.: 09/100,906

[22] Filed: Jun. 19, 1998

[51] Int. Cl.⁶ ..................................................... F25B 21/02
[52] U.S. Cl. ............................ 62/3.2; 62/259.2; 361/700; 165/104.33
[58] Field of Search .................... 62/259.2, 3.2; 361/700; 165/104.33

[56] References Cited

U.S. PATENT DOCUMENTS

| | | | |
|---|---|---|---|
| 5,188,286 | 2/1993 | Pence, IV | 236/1 F |
| 5,339,214 | 8/1994 | Nelson | 361/695 |
| 5,513,070 | 4/1996 | Xie et al. | 361/700 |
| 5,549,155 | 8/1996 | Meyer, IV et al. | 165/104.33 |
| 5,568,360 | 10/1996 | Penniman et al. | 361/687 |
| 5,598,320 | 1/1997 | Toedtman et al. | 361/687 |
| 5,634,351 | 6/1997 | Larson et al. | 62/259.2 |
| 5,731,954 | 3/1998 | Cheon | 361/699 |
| 5,794,454 | 8/1998 | Harris et al. | 62/259.2 |

OTHER PUBLICATIONS

Wu, "A Silent Cool", Science News, vol. 152, Sep. 6, 1997, pp. 152–153.

*Primary Examiner*—Henry Bennett
*Assistant Examiner*—Mark Shulman
*Attorney, Agent, or Firm*—Daniel P. Morris; Alvin J. Riddles

[57] ABSTRACT

Heat transfer out of a housing for a localized source of heat such as that produced by a semiconductor chip of electronic apparatus is provided by a low thermal impedance heat transfer member such as a heat pipe, a thermal reservoir or heat transfer buffering member and a Peltier effect device interfaced with the thermal reservoir and the ambient surrounding the housing so as to provide a refrigeration function for the thermal reservoir. A high heat capacity or high latent heat of phase transition material can be used for the thermal reservoir. In a portable computer with a battery power supply, the thermal reservoir can be independent or the battery can be employed in the thermal reservoir functions.

15 Claims, 2 Drawing Sheets

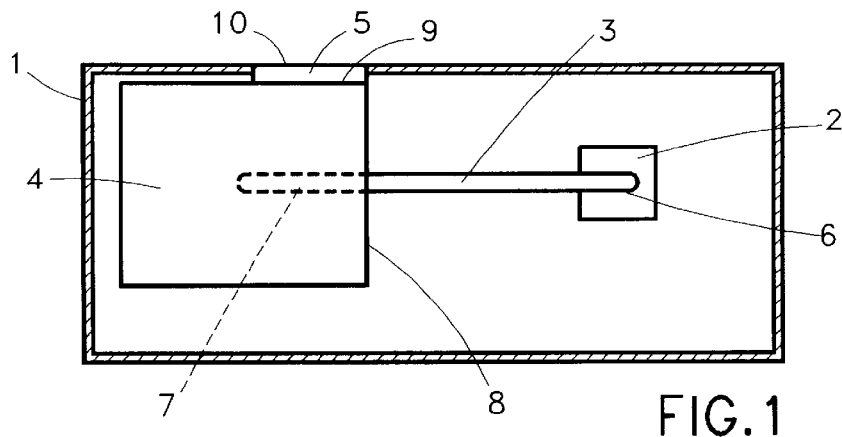
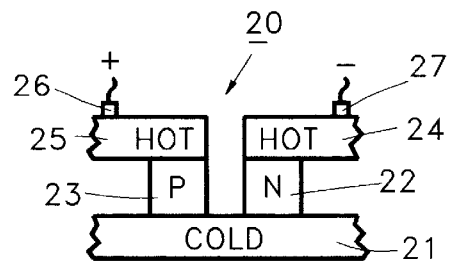
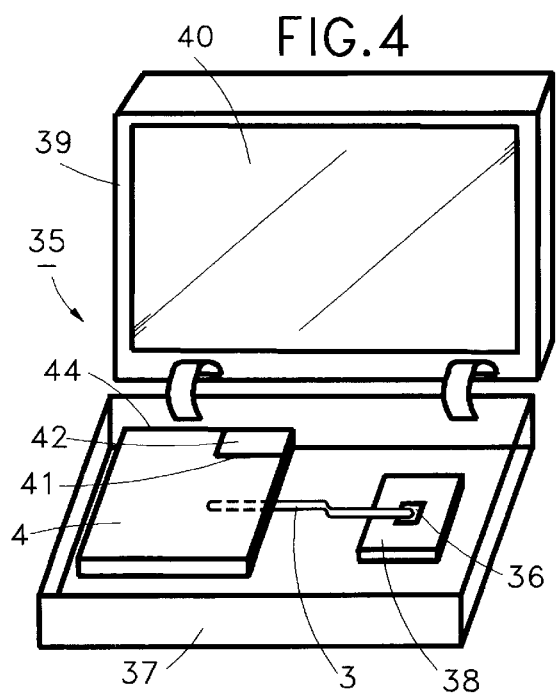
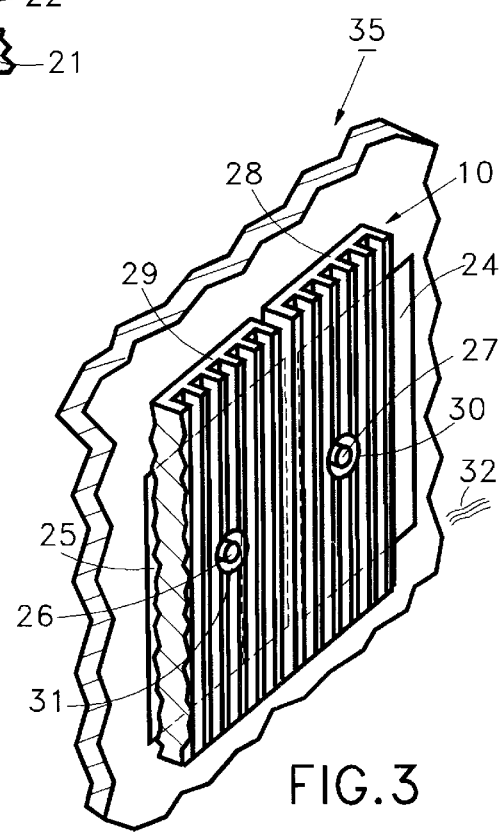

ELECTRONIC COMPONENT COOLING
USING A HEAT TRANSFER BUFFERING
CAPABILITY

FIELD OF THE INVENTION

The invention is directed to the use of a rechargeable thermal reservoir capability in transferring heat from a localized heat source such as a component in electronic apparatus where power consumption and weight are significant parameters and in particular to the transfer of heat from a semiconductor chip to a thermal reservoir for temporary holding and eventual dissipation outside the housing of a portable computer.

BACKGROUND AND RELATION TO THE PRIOR ART

As electronic apparatus configurations progress in performance and compactness it becomes more difficult to control heat dissipation where there are individual components that produce locallized heat. This is particularly the situation in the portable computer technology where, as there is progress with greater performance, the heat generated by certain individual small components such as a semiconductor chip can generate so much heat in such a localized place that it is becoming increasingly difficult to extract or otherwise control. Gains achieved in portability, component density and performance in electronic apparatus are usually accompanied by increasing difficulty in removing localized heat from an individual high heat producing component by simply using the traditional physical mechanisms of conduction, convection and radiation.

Thermoelectric cooling devices using the Peltier principle have been receiving increasing attention in the art. Such devices, that are usually made of a telluride compound, respond to an electrical current by producing a locallized cooler region. A number of structures and applications of the devices are described in an article by C. Wu, in Science News, Sept. 6, 1997, pages 152 and 153. Such devices however, at this stage of the art have not been employed in situations where the carrying of high wattage has been necessary. They have been used in computers in sensing type applications in where the Peltier effect locallized cool region is used to indicate the occurrence of an event. An example is U.S. Pat. No. 5,188,286.

SUMMARY OF THE INVENTION

In the invention, the combination in a housing; of a very low thermal impedance heat transfer member such as a heat pipe, a thermal reservoir or heat transfer buffering member and a Peltier effect device interfaced with the thermal reservoir and the ambient surrounding the outside of the housing so as to produce a refrigeration function for the thermal reservoir are employed to transfer locallized heat that is generated at a component, at a rate that is usually high, to buffer that heat by storing it in the thermal reservoir, from which it can then be removed and dissipated in an external ambient at selected intervals and ,or, rates through selective application of electrical power to the Peltier effect device. In a battery powered portable computer the Peltier effect refrigeration operation can occur during the battery recharging cycle. Heat developed at a localized source such as a chip is immediately conducted away through a low thermal impedance conduit, or heat pipe for storage in the thermal reservoir. The thermal reservoir retains the heat in a high density heat storage material which may include the use of the latent energy in a phase transition of the storage material. The Peltier effect device is positioned to serve as a refrigerator for the thermal reservoir or heat buffer in transferring the stored heat to an external ambient, and where desired, to precool and thus to increase the capacity of the thermal reservoir. In a portable computer with a battery power supply the battery can serve as the thermal reservoir and where more than one battery is used, one battery can serve as a thermal reservoir including employing phase transition of the electrolyte as latent energy storage while the other battery is providing operating power.

BRIEF DESCRIPTION OF THE DRAWINGS

FIG. 1 is a schematic illustration of the position relationship of the locallized heat source, the heat pipe, the thermal reservoir and the Peltier effect refrigerating member of the invention.

FIG. 2 is a schematic illustration of the elements and their positions in a Peltier effect device.

FIG. 3 is a perspective illustration of the functional aspects at the Peltier effect device interface with the surrounding ambient.

FIG. 4 is a perspective schematic of the elements of the invention in illustrative positions in a portable computer housing.

FIG. 5 is an illustration where the battery is in a dual capacity as both power source and thermal reservoir, and where,.

FIG. 6 is a schematic illustration of the elements of the invention with two batteries, one involving the use of a low temperature phase transition, and that can replace the other as the power source when it becomes warmed, thus providing extended time between charging.

DESCRIPTION OF THE INVENTION

Figure 5:
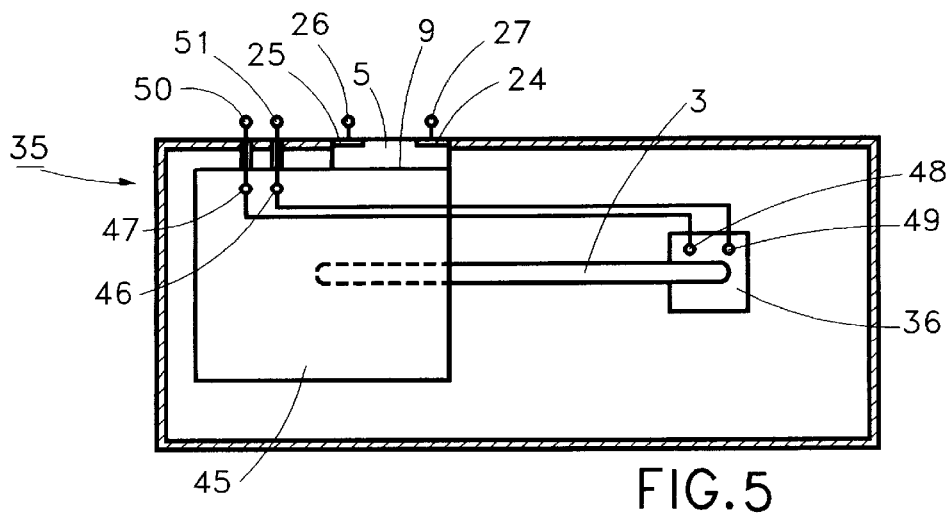
FIGS. 5 and 6 are illustrations of the use of a battery in a portable computer as a thermal reservoir, where.

In the invention, the combination in a housing of a heat pipe, a thermal reservoir and a Peltier effect device serving as a refrigerator member are assembled to produce a capability that is able to immediately transfer away heat being generated in a locallized area, to buffer that heat in a thermal reservoir and controlling the storage and transfer of that heat to the ambient through the use of an interfaced Peltier effect device that performs the functions of a refrigerating member for the thermal reservoir and transfer of extracted heat to the ambient outside the housing.

The thermal reservoir retains that heat in a high heat density storage material which may include the use of the latent energy in a phase transition of the storage material as a storage physical mechanism. The locallized heat that is developed, usually at a high rate at the component is immediately transferred away from the area of the component through a low thermal impedance conduit or heat pipe to the storage in the thermal reservoir. A Peltier effect device is positioned to have a good thermal transfer interface with the thermal reservoir and also to have a good thermal transfer interface with the surrounding ambient outside the housing, and to have connections to an external source of power for the Peltier effect device for selective removal of the stored heat. Where desired, precooling of the thermal reservoir can increase the thermal capacity of the thermal reservoir.

In a portable computer with a battery power supply, there will be a periodic connection to substantial power when the battery is to be recharged, that is employed in the invention for high wattage supply of refrigeration power through the external contacts of the Peltier effect device.

It will be apparent that within the principles of the invention that there will be flexibility in the constructions employed for the thermal reservoir. As examples, the shape can vary from a thin flat layer the area of a dimension of the housing at one extreme to a compact discrete volume element such as the battery at another extreme. Insulation around the thermal reservoir may be advantageous usually under circumstances where space permits and there is a large temperature difference in the presence of moisture. The buffering of high rate, locally produced, heat, in a thermal reservoir of the invention will normally operate in parallel with and will not affect any other conventional heat dissipation being used. This combination of thermal buffering and conventional heat dissipation will accommodate the greatest heat production while maintaining acceptable temperatures on the outside of the electronic apparatus housing. In a situation such as in an infrared invisibility military application where a very cool outside housing temperature is desired, the normal heat dissipation mechanism can be minimized by insulation.

In FIG. 1. there is shown a schematic illustration of the positioning relationship, in an electronic apparatus housing 1, of the combination of the locallized heat source 2, the heat pipe 3, the thermal reservoir 4, and the Peltier effect device refrigerating member 5 of the invention. The element 2 is, a relatively small (in area) component of the electronic apparatus, in relation to the overall housing 1 area, such as for example a semiconductor chip. The housing 1 is generally of an insulating plastic or composite material. A metal housing can also be used. The element 3 is a low thermal impedance heat transferring device such as one of the various types of heat pipes well known and available in the art for high efficiency heat transfer. The heat pipe generally has sealed ends of a conduit tube that contains a liquid that can be vaporized at one end, which is positioned at a source of heat, with the liquid being condensed at the other end which is positioned at the location to which the heat is to be transferred. The heat pipe 3 has a good thermal transfer connection 6 to the locallized source of heat 2, such as by a fusing or soldering. There is also a good thermal transfer into the thermal reservoir 4 such as would occur by the heat pipe 3 being fused to a housing 8 of the thermal reservoir 4 or through the use of an insertion 7 of the end of the heat pipe 3, shown dotted, into the thermal reservoir heat responsive material. The thermal reservoir 4 may be considered to be a thermal buffering device into which heat can be transferred at one rate for subsequent release at a different rate. Materials that have phase transitions that involve a change of physical form, such as from liquid to solid, that are accompanied by significant absorption or release of latent energy related to the phase transition, are usually the more efficient thermal reservoir materials. A battery of the type used to power the portable computer can serve as a thermal reservoir and the electrolyte of a battery can serve as a phase transition material.

A Peltier effect device, sometimes called a heat pump in the art, is provided with interfaces and power application to serve the function of a refrigerating member 5 in transferring the heat stored in the thermal reservoir 4 to the surrounding ambient outside the housing 1. The refrigerating function is also useful to precool the thermal reservoir and thereby to extend the thermal capacity. The refrigerating member 5 includes a Peltier effect electrothermal temperature changing device wherein, in essence, electrical current passing through different materials can produce a temperature change. Peltier effect devices are well known in the art and are available as components In accordance with the invention a selected wattage Peltier effect device is positioned with the portion that is to become cold at an interface 9 in good thermal contact with the thermal reservoir 4, and with both the hot portions and the electrical terminals at a common interface 10 extending through the housing 1 and into contact with the ambient surrounding the housing.

In operation in accordance with the invention, heat generated at the localized source 2 such as a semiconductor chip, is transferred through the heat pipe 3 and stored in the thermal reservoir 4, from which the Peltier effect refrigerating member 5 can extract the stored heat. A Peltier effect device heretofore in the art has had a power efficiency limitation. Such a limitation is overcome in the application in this invention by positioning, interfacing and providing external high wattage power during a selected thermal transfer period.

Referring to FIG. 2 there is shown a functional illustration of a semiconductor type of Peltier device. In the illustrative Peltier effect device 20 there is a cold portion 21 at the junction between the n, 22 and p, 23 semiconductor elements on which there are segments 24 and 25 that get hot when power is applied between terminals 26 and 27. Peltier effect devices are available in the art as discrete components, in a range of wattage capacities. The materials used in their construction are typically telluride based; the most common being Bismuth-Telluride. A well known supplier is Marlow Industries, Dallas Tex. The device 20 is positioned so that the cold portion 21 is in good thermal transfer contact with the thermal reservoir 4 with the hot portions 24 and 25 and electrical contacts 26 and 27 being in contact with the ambient outside the housing 1.

In an embodiment such as a battery driven portable computer there is a battery charging cycle during which external power to a selected wattage size Peltier effect device can extract the stored heat from the thermal reservoir during the time of that cycle and transfer that heat for dissipation into the ambient outside the portable computer housing.

In FIG. 3 there is illustrated the functional aspects of the interface of the Peltier effect device with the surrounding ambient, in which the same reference numerals as used in FIGS. 1 and 2 are used for the same elements. In FIG. 3 the separate hot portions 24 and 25 extend through the interface 10 of the housing 1. The heat extraction structure of the interface is illustrated as being achieved using separate and similar finned radiant transfer members 28 and 29 that operate to transfer the heat away from the respective hot portions 24 and 25 without shorting the electrical path between terminals 26 and 27 that extend through clearance openings 30 and 31, into the ambient 32. It will be apparent that the physical size of the symbolic elements 28 and 29 will be determined by the amount of heat to be extracted during the time of operation of the Peltier effect device, the wattage size of the Peltier effect device and the thermal absorption conditions of the ambient 32 into which the heat is to be transferred. The interface of FIG. 3 permits both application of high wattage electrical current external power to the Peltier effect device 20 while efficiently transferring the extracted heat from the thermal reservoir 4 to the ambient 32 surrounding the housing.

Referring next to FIG. 4 where there is shown a perspective schematic of an illustrative relative positioning of the elements of the invention in an example electronic apparatus housing such as that of a portable computer. The illustrated housing 35 is of the type where a localllized heat source component such as the processor chip 36 is positioned in the base 37 under the keyboard not shown. The chip 36 is shown mounted on a standard in the art heat sink 38. The buffered heat removal capability of the invention is independent from and generally works in parallel with any standard type of heat sink dissipation. The housing 35 also has a hinged portion 39 that contains a display 40. The hinged portion 39 serves as a cover when closed over the base 37. There is some flexbility, in ith size and shape of the thermal reservoir member 4 which for illustration purposes is shown as a rectangular solid. The thermal reservoir member 4 need only have; sufficient thermal capacity to buffer all excess heat produced at the localllized source 36 at a rate greater than that at which the heat sink 38 could dissipate it. The ratio of rate of heat dissipation to the outside in relation to the heat stored in the thermal reservoir is flexible at the time of design and should be optimized for particular applications. The thermal reservoir should be positioned in a portion of the base housing 37 in relation to the localllized heat source 36 adapted for heat transfer through the heat pipe 3 and having a good thermal transfer interface area 41 for transfer of the buffered heat to the Peltier effect refrigerating member 42. In fact, since the Peltier effect refrigerating member 42 is a physically small component and requires both electrical and thermal access outside the housing 37 as described in connection with FIGS. 2 and 3, and a battery in one embodiment is an advantageous thermal reservoir, an advantageous positioning of the thermal reservoir 4 would be as illustrated with a side 44 adjacent to the housing 37 for the type of connection through the housing 37 depicted as 10 in FIG. 1 and further illustrated in FIG. 3. Battery charging connections are then also readily achieved through the housing. In the portable computer art there are available structures called docking stations that retain a portable computer housing in contact with battery charging power supplies and which can also be equipped with and are modifiable for any specialized heat dissipation desired.

The principles of the invention are amenable to a wide variety of construction variations in implementation, and in types of apparatus applications. One such type of apparatus variation currently receiving attention in the art is the packing of ever higher performance into a portable computer while trying to keep the overall size comparable to a notebook, the overall weight around 5 pounds and the outside temperature so as to be comfortable resting on a user's lap.

The common Lithium ion electrolyte type portable computer battery has several useful features that are advantageous in a thermal reservoir type application. The battery is fairly compact and is adaptable to be a removable unit. It has a relatively broad temperature range of operation so that in a dual role of both power source and thermal reservoir, precooling of the battery to the bottom of that range during a charging cycle can provide locally generated heat storage up to the vicinity of the top of the range and an extension of the time until recharging is deeded. The battery also has an electrolyte that can be caused to undergo a phase transition at about −20 degrees C., within comfortable range of Peltier effect devices so as to permit latent heat to be a part of the heat heat storage physical mechanism The effectiveness of latent heat as a thermal reservoir is illustrated by the fact that an electrolyte after a phase transition to solid, comparable to that of water, in a 355 milliliter quantity, which is about the quantity in a common portable computer battery, absorbs a quantity of latent heat in remelting sufficient to cool a 25 Watt computer processor chip for about 1½ hours.

The battery used to power a portable computer can thus in accordance with the invention be adapted to serve as both a source of power for the computer and as a thermal reservoir.

Figure 6:
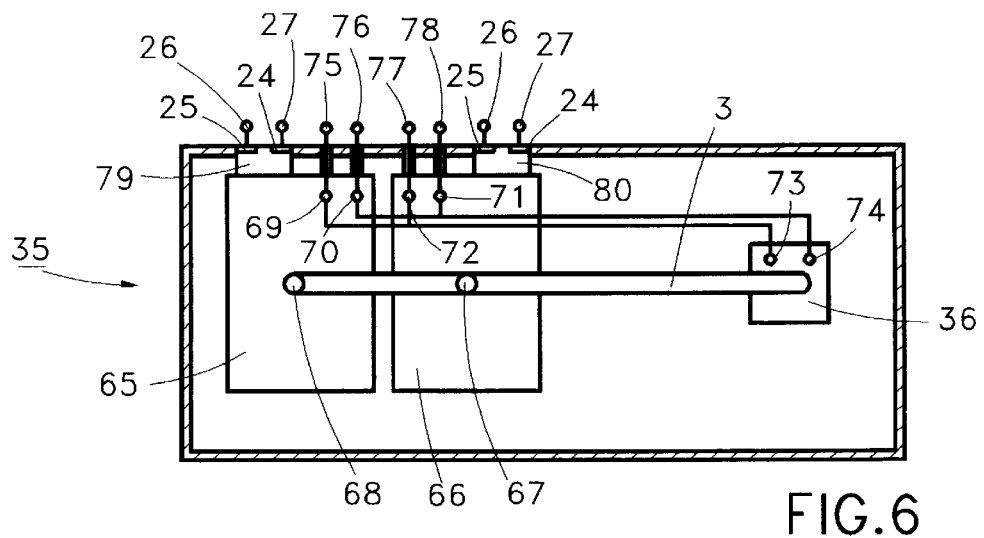

In FIGS. 5 and 6 illustrations are provided respectively of the use of a battery in a portable computer in a dual role of power source and thermal reservoir, and of separate batteries where one of which can serve as a power source while the other can serve as a thermal reservoir.

Referring to FIG. 5, where the same reference numerals as in FIGS. 1–4 are used as apporpriate, within the housing 35, the thermal reservoir 45, which is the battery of the portable computer, has heat, produced at the chip 36, transferred through the heat pipe 3. Power supplied from the battery-thermal reservoir 45 through terminals 46 and 47 to terminals 48 and 49 at the chip 36 and recharging is through terminals 50 and 51 that extend through the housing 35. There is a Peltier effect device refrigerating member 5 with a good thermal transfer interface 9 corresponding to the cold element 21 of the element 20 of FIG. 2, in contact with the thermal reservoir 45. The Peltier effect refrigerator member 5 extends through the housing 35 to the surrounding ambient of the portable computer with the hot segments 24 and 25 and the power terminals 26 and 27 also exposed. As described in connection with FIG. 3, the finned dissipation elements 28 and 29 would be in contact with the hot segments 24 and 25 during the heat extraction period which would probably coincide with the charging cycle.

In operation, in FIG. 5 a 25 watt for example Peltier effect device is separately powered through terminals 26 and 27 to precool the battery 45 to the bottom of the operating range temperature, during the recharging cycle of the battery 45 which is powered through terminals 50 and 51. The separate extraction of the localllized, component produced heat, then contributes to control of the temperature of the computer and substantially extends the time until there is a need for recharging, by eliminating the need for electrical battery driven cooling, such as a fan mechanism. This becomes more and more advantageous as the total chip wattage exceeds that which can be comfortably or effectively dissipated in the traditional passive manner.

Referring to FIG. 6, where the same reference numerals as in FIGS. 1–4 are used as appropriate, within the housing 35, there are two batteries-thermal reservoirs 65 and 66, both of which are batteries of the lithium electrolyte type for example used in portable computers. Heat, produced at the chip 36, is transferred through the heat pipe 3 into both batteries-thermal reservoirs 65 and 66 at points 67 and 68 respectively. Power supplied from the battery-thermal reservoirs 65 and 66, at terminals 69 and 70, and 71 and 72, respectively are connected to terminals 73 and 74 at the chip 36, and recharging is through terminals 75 and 76 ,and 77 and 78, each pair of which extends through the housing 35. There is a separate Peltier effect device refrigerating member 79 and 80, for each battery-thermal reservoir 65, 66 respectively, each with a good thermal transfer interface 81 and 82 each corresponding to the cold element 21 of the element 20 of FIG. 2, in contact with the thermal reservoir 45. The Peltier effect refrigerator members 79 and 80 each extend through the housing 35 to the surrounding ambient of the portable computer, with the hot segments 24 and 25and the power terminals 26 and 27 for each, also exposed. As described in connection with FIG. 3, the finned dissipation elements 28 and 29 for each of the Peltier effect devices 79 and 80 would be in contact with the hot segments 24 and 25 during the heat extraction period which would probably coincide with the charging cycle.

In operation, during a charging cycle in which each of battery-thermal reservoirs 65,66 is charged through terminals 75 and 76, and 77 and 78; a first of the battery-thermal reservoirs 65, 66 would be precooled through it's respective one of Peltier effect devices 79 and 80, to the bottom of the battery operating temperature range, for example 0 degrees C. and the second of the battery-thermal reservoirs 65 and 66 would be precooled through it's Peltier effect device through the electrolyte phase transition to solid, for example −20 degrees C. The first battery-thermal reservoir provides initial power and locallized heat is transferred through heat pipe 3 to both battery-thermal reservoirs. The second battery-thermal reservoir comes up to useful output power as the first reaches need for recharging. It will be apparent that with standard instrumentation and switching, not shown, other configurations for use and for control over temperature profiles may be selected.

Figure 7:
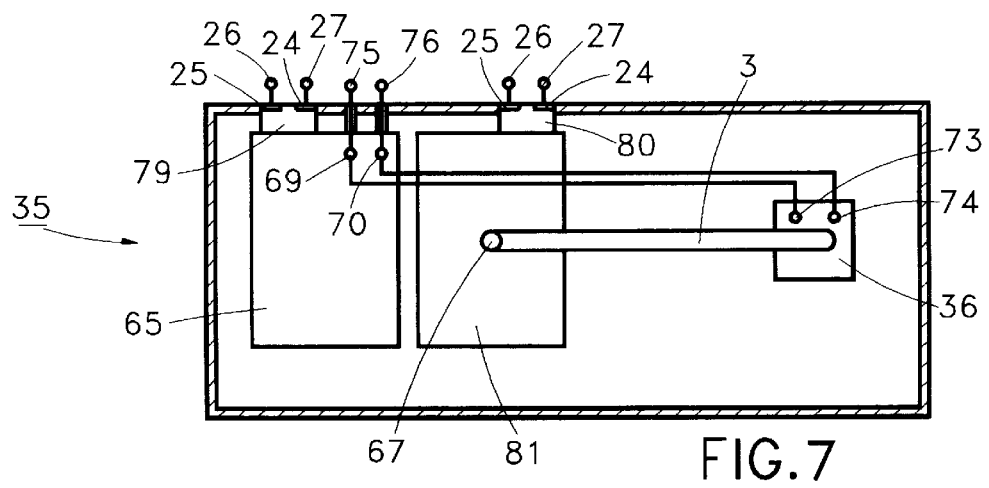
FIG. 7 is a schematic illustration of the elements of the invention where there is a battery and a separate thermal reservoir.

Referring to FIG. 7 wherein the same reference numerals as in FIG. 6 are used for like elements as appropriate a schematic illustration is provided where there is a battery 65 rechargeable through elements 69 and 70 and 75 and 76, and a separate thermal reservoir 81 that has heat stored in it through heat pipe 3 at element 67 and which is periodically refrigerated through element 80 and terminals 24–27. The providing of the separate thermal reservoir 81 broadens the choices of heat capacity and latent heat materials.

What has been described is a thermal reservoir capability for extraction of locally generated heat at a component of an electronic apparatus and dissipating the heat into the ambient outside the apparatus housing.

What is claimed is:

1. In electronic apparatus having within a housing, a localized source of heat, the improvement comprising:

a thermal reservoir member positioned in said electronic apparatus housing, low thermal impedance means adapted for transferring heat from said localized heat source into said thermal reservoir member, and, a Peltier effect refrigerating member having first and second hot portions and a cold portion and electrical input contacts to said first and second hot portions, said Peltier effect refrigerating member being positioned in said housing with said first and second hot portions and said electrical input contacts exposed outside said housing and said cold portion being in good thermal transfer contact with said thermal reservoir member.

2. The improvement of claim 1 wherein said low thermal impedance means is a heat pipe.

3. The improvement of claim 2 wherein said locallized source of heat is an electronic component of said apparatus.

4. The improvement of claim 3 wherein said apparatus is a portable computer and said housing has a base and cover.

5. The improvement of claim 4 wherein said locallized source of heat is a semiconductor chip located in said base.

6. A buffering capability for heat occurring at a first rate at a localized source in a housing for dissipation at a second rate that is different from said first rate into the ambient surrounding the housing;

comprising in combination:

a thermal reservoir member capable of storage of heat positioned in said housing, a low thermal impedance heat transfer member adapted for transfer of said heat occurring at said locallized source to said thermal reservoir, and, a Peltier effect refrigerating member having a good thermal transfer interface with said thermal reservoir and having electrical and thermal members extending into said ambient surrounding said housing for heat transfer to said ambient at said second rate.

7. The buffering capability of claim 6 wherein said storage of heat in said thermal reservoir includes a latent heat through phase transition property of the material in said thermal reservoir.

8. The buffering capability of claim 7 wherein said locallized source of heat is a semiconductor chip.

9. The buffering capability of claim 8 wherein said low impedance heat transfer is with a heat pipe.

10. The buffering capability of claim 9 wherein said housing is the housing of a portable computer and said ambient surrounds the outside of said housing.

11. In electronic apparatus having within a computer base type housing, a component chip source of heat, the improvement for heat transfer buffering comprising:

a thermal reservoir battery member positioned in said housing, low thermal impedance heat pipe means for transferring heat from said chip into said thermal reservoir battery member, and, a Peltier effect refrigerating member having a cold portion and first and second hot portions, with electrical input connections to said first and second hot portions, said Peltier effect refrigerating member being positioned in said housing with said first and second hot portions and said electrical input contacts exposed outside said housing and said cold portion being in good thermal transfer contact with said thermal reservoir battery member.

12. A buffering capability for heat occurring at a first rate at a computer chip in a portable computer housing that is surrounded by an ambient, for dissipation at a second rate that is different from said first rate, into said ambient;

comprising in combination:

a portable computer power supply battery type thermal reservoir member, said reservoir member being capable of storage of heat that includes latent heat through a phase transition of a material in said battery type thermal reservoir, a low thermal impedance heat pipe adapted for transfer of said heat from said computer chip to said battery type thermal reservoir, and, a Peltier effect refrigerating member having a good thermal transfer interface with said battery type thermal reservoir and having electrical and thermal members extending into said ambient for heat transfer at said second rate.

13. The process of extracting heat from a component of an electronic apparatus positioned in a housing that is surrounded by an ambient, comprising in combination the steps of:

providing a thermal reservoir heat storage capability positioned in said housing, delivering heat from said component to said thermal reservoir heat storage capability through a heat pipe, and, controlling delivery of heat stored in said thermal reservoir heat storage capability to said ambient by a Peltier effect refrigerating member having a cold portion and first and second hot portions with electrical contacts to said first and second hot portions, said Peltier effect refrigerating member having said cold portion in good thermal contact with said thermal reservoir heat storage capability, and having said first and second hot portions and said electrical contacts, extending through said housing to said ambient.

14. The process of claim 13 wherein said thermal reservoir heat storage capability is at least one battery.

15. The buffering capability of claim 6 wherein said thermal reservoir member is at least one battery.

* * * * *